(12) United States Patent
Chen et al.

(10) Patent No.: US 11,756,942 B2
(45) Date of Patent: Sep. 12, 2023

(54) FAN-OUT PACKAGING STRUCTURE AND METHOD

(71) Applicant: SJ SEMICONDUCTOR (JIANGYIN) CORPORATION, Jiangyin (CN)

(72) Inventors: Yenheng Chen, Jiangyin (CN); Chengchung Lin, Jiangyin (CN)

(73) Assignee: SJ SEMICONDUCTOR (JIANGYIN) CORPORATION, Jiangyin (CN)

( * ) Notice: Subject to any disclaimer, the term of this patent is extended or adjusted under 35 U.S.C. 154(b) by 170 days.

(21) Appl. No.: 17/476,371

(22) Filed: Sep. 15, 2021

(65) Prior Publication Data

US 2022/0084997 A1    Mar. 17, 2022

(30) Foreign Application Priority Data

Sep. 15, 2020    (CN) .......................... 202010969171.0
Sep. 15, 2020    (CN) .......................... 202022013524.8

(51) Int. Cl.
| | |
|---|---|
| *H01L 25/16* | (2023.01) |
| *H01L 21/56* | (2006.01) |
| *H01L 23/31* | (2006.01) |
| *H01L 25/00* | (2006.01) |
| *H01L 23/00* | (2006.01) |
| *H01L 23/538* | (2006.01) |

(52) U.S. Cl.
CPC .......... *H01L 25/162* (2013.01); *H01L 21/568* (2013.01); *H01L 23/3107* (2013.01); *H01L 23/5389* (2013.01); *H01L 24/24* (2013.01); *H01L 24/82* (2013.01); *H01L 24/96* (2013.01); *H01L 25/50* (2013.01); *H01L 2224/24145* (2013.01); *H01L 2224/82101* (2013.01)

(58) Field of Classification Search
CPC ..... H01L 25/162; H01L 25/50; H01L 21/568; H01L 23/3107; H01L 23/5389; H01L 24/24; H01L 24/82; H01L 24/96; H01L 2224/24145; H01L 2224/82101; H10B 80/00; H10K 39/10; H10K 59/95; H10N 19/00; H10N 39/00; H10N 59/00; H10N 79/00; H10N 89/00
See application file for complete search history.

(56) References Cited

U.S. PATENT DOCUMENTS

| | | | |
|---|---|---|---|
| 10,424,563 B2 * | 9/2019 | Lin ....................... | H01L 24/94 |
| 2020/0035625 A1 * | 1/2020 | Wang ................. | H01L 23/3135 |

* cited by examiner

*Primary Examiner* — Timor Karimy
(74) *Attorney, Agent, or Firm* — Alston & Bird LLP (57) ABSTRACT

The present disclosure provides a fan-out packaging structure and a method of fabricating the same. The fan-out packaging structure includes a redistribution layer, a passivation layer, a semiconductor chip, a first packaging layer, a groove, first metal bumps, second metal bumps, an adapter board, a stacked chip package, a passive element, and a filling layer. By means of the present disclosure, various chips performing different functions can be integrated into one packaging structure, thereby improving the integration level of the fan-out packaging structure. By means of the redistribution layer, the adapter board, and the first and second metal bumps, a three-dimensional vertically stacked packaging is achieved. As the result, in addition to improved integration level, the conduction paths in the packaging structure can be effectively shortened, thereby reducing power consumption, increasing the transmission speed, and increasing the data processing capacity.

5 Claims, 7 Drawing Sheets

FAN-OUT PACKAGING STRUCTURE AND METHOD

CROSS REFERENCE TO RELATED APPLICATION

The present application claims the benefit of priority to Chinese Patent Application No. CN 2020109691710, entitled "FAN-OUT PACKAGING STRUCTURE AND METHOD", and Chinese Patent Application No. CN 2020220135248, entitled "FAN-OUT PACKAGING STRUCTURE", both filed with CNIPA on Sep. 15, 2020, the disclosures of which are incorporated herein by reference in their entirety for all purposes.

FIELD OF TECHNOLOGY

The present disclosure generally relates to semiconductor packaging technology, and in particular, to a fan-out chip packaging structure and method.

BACKGROUND

To have a more reliable and faster packaged circuit having a higher density and lower cost is the main goal of packaging integrated circuit chips. With the advent of the era of 5G communications and artificial intelligence, the amount of data to be transmitted and interactively processed by chips is relatively large, and demands generated by the mobile Internet and the Internet of Things (IoT) are increasingly stronger. Therefore, miniaturization and multi-functionalization of electronic terminal products are trending in the industry. How to integrate and package a plurality of high-density chips of different types to form a powerful system having low power consumption has become a major challenge in the field of advanced semiconductor chip packaging.

Fan-out wafer level packaging (FOWLP) has become one of the relatively advanced methods for fan-out packaging because to it has more input/output ports (I/O) and better integration flexibility. However, in the existing fan-out packaging technology, due to limited distribution accuracy, packages have relatively large area and thickness, and have numerous problems such as cumbersome processes and low reliability.

Therefore, it is necessary to provide a new fan-out packaging fan-out chip packaging structure and method.

SUMMARY

The present disclosure provides a method of fabricating a fan-out chip package, comprising the following steps:
providing a support substrate, and forming a separation layer on the support substrate;
forming a passivation layer on the separation layer, where the passivation layer comprises a first surface which is in contact with the separation layer and a second surface facing opposite to the first surface;
providing a semiconductor chip, where the semiconductor chip is disposed on the second surface of the passivation layer, a back side of the semiconductor chip is bonded to the passivation layer, and a front side of the semiconductor chip faces away from the second surface of the passivation layer;
packaging the passivation layer and the semiconductor chip by a first packaging layer, where a pad of the semiconductor chip is configured to be exposed from the first packaging layer;
forming a redistribution layer on the first packaging layer, where the redistribution layer comprises a first surface in contact with the first packaging layer and a second surface opposite to the first surface, and the redistribution layer is electrically connected to the pad of the semiconductor chip;
forming first metal bumps on the second surface of the redistribution layer, where the first metal bumps are electrically connected to the redistribution layer;
providing a carrier, and peeling off the support substrate to expose the first surface of the passivation layer;
performing laser etching on the passivation layer and the first packaging layer to form a groove, where a metal distribution layer in the redistribution layer is exposed from the groove;
forming second metal bumps in the groove, where the second metal bumps are electrically connected to the redistribution layer;
providing an adapter board, where the adapter board is disposed on the first surface of the passivation layer and electrically connected to the second metal bump;
providing a stacked chip package and a passive element, where the stacked chip package and the passive element are disposed on the adapter board, and are both electrically connected to the adapter board;
filling a gap between the stacked chip package and the adapter board with a filling layer; and
performing cutting to form the fan-out packaging structure.

Optionally, after forming the filling layer and before the cutting, the method further comprises a step of packaging the adapter board, the stacked chip package, and the passive element by a second packaging layer.

Optionally, the height of the second metal bumps is greater than the thickness of the semiconductor chip.

Optionally, the stacked chip package comprises an embedded-package-on-package (ePoP) memory.

Optionally, the passive element comprises one or more of a resistor, a capacitor, and an inductor.

The present disclosure further provides a fan-out chip packaging structure. The fan-out chip packaging structure comprises:
a redistribution layer, comprising a first surface and a second surface opposite to each other;
a passivation layer, comprising a first surface and a second surface opposite to each other;
a semiconductor chip, disposed between the second surface of the passivation layer and the first surface of the redistribution layer, where a back side of the semiconductor chip is bonded to the second surface of the passivation layer, and a front side of the semiconductor chip faces away from the passivation layer and is electrically connected to the redistribution layer;
a first packaging layer, disposed between the second surface of the passivation layer and the first surface of the redistribution layer and configured to cover the passivation layer, the redistribution layer, and the semiconductor chip;
a groove, extending through the passivation layer and the first packaging layer to expose a metal distribution layer in the redistribution layer;
first metal bumps, disposed on the second surface of the redistribution layer and electrically connected to the redistribution layer;
second metal bumps, disposed in the groove and electrically connected to the redistribution layer;
an adapter board, disposed on the first surface of the passivation layer and electrically connected to the second metal bump;

a stacked chip package and a passive element, disposed on the adapter board and electrically connected to the adapter board; and a filling layer, disposed between the stacked chip package and the adapter board and configured to fill a gap between the stacked chip package and the adapter board.

Optionally, the fan-out packaging structure further comprises a second packaging layer, configured to cover the adapter board, the stacked chip package, and the passive element.

Optionally, the height of the second metal bumps is greater than the thickness of the semiconductor chip.

Optionally, the stacked chip package comprises an ePoP memory; and the passive element comprises one or more of a resistor, a capacitor, and an inductor.

Optionally, the first packaging layer comprises one of an epoxy resin layer, a polyimide layer, and a silica gel layer. The filling layer comprises one of the epoxy resin layer, the polyimide layer, and the silica gel layer.

As described above, by means of the fan-out packaging structure and the method of fabricating a fan-out chip package consistent with the present disclosure, various chips having different functions can be integrated into one packaging structure, thereby improving the integration level of the fan-out packaging structure. By means of the redistribution layer, the adapter board, and the metal bumps, three-dimensional vertically stacked packaging is achieved. In this way, the integration level of the packaging structure can be effectively improved, and the conduction paths can be effectively shortened, thereby reducing power consumption of the subsequently prepared device, increasing the transmission speed, and increasing the data processing capacity of the device.

BRIEF DESCRIPTION OF THE DRAWINGS

FIG. 16 and FIG. 18 are also schematic structural diagrams of two variations of fan-out chip packaging structures according to the present disclosure.

DETAILED DESCRIPTION

The implementations of the present disclosure are described below through specific examples. Those skilled in the art can easily understand the other advantages and effects of the present disclosure from the content disclosed in this specification. The present disclosure may also be implemented or applied through other different specific implementations. Various details in this specification may also be modified or changed based on different viewpoints and applications without departing from the spirit of the present disclosure.

For example, when describing the embodiments of the present disclosure in detail, for ease of description, a cross-sectional view for showing a device structure is partially enlarged not necessarily to scale, and the schematic diagram is merely an example and is not intended to limit the scope of the present disclosure.

For ease of description, spatial terms, such as "under", "below", "lower", "beneath", "above", "upper", and the like, may be used herein to describe the relationship between one element or feature and another element or feature as shown in the accompanying drawings. It is to be understood that these spatial terms are intended to encompass other directions of the device in use or operation than the directions depicted in the accompanying drawings. In addition, when a layer is referred to as being "between" two layers, the layer may be the only layer between the two layers, or one or more layers may be present therebetween. As used herein, "between . . . and . . . " means that two endpoint values are included.

In the context of this application, a structure in which a first feature is described as being "on" a second feature may include an embodiment in which the first feature and the second feature are in direct contact with each other, or may include an embodiment in which there is another feature formed between the first feature and the second feature. In other words, the first feature and the second feature may not be in direct contact with each other.

It should be noted that, the drawings provided in one embodiment only exemplify the basic idea of the present disclosure. Although only the components related to the present disclosure are shown in the drawings, and are not drawn according to the quantities, shapes, and sizes of the components during actual implementation. During actual implementation, the patterns, quantities, and proportions of the components may be changed as needed, and the layout of the components may be more complicated.

Figure 1:
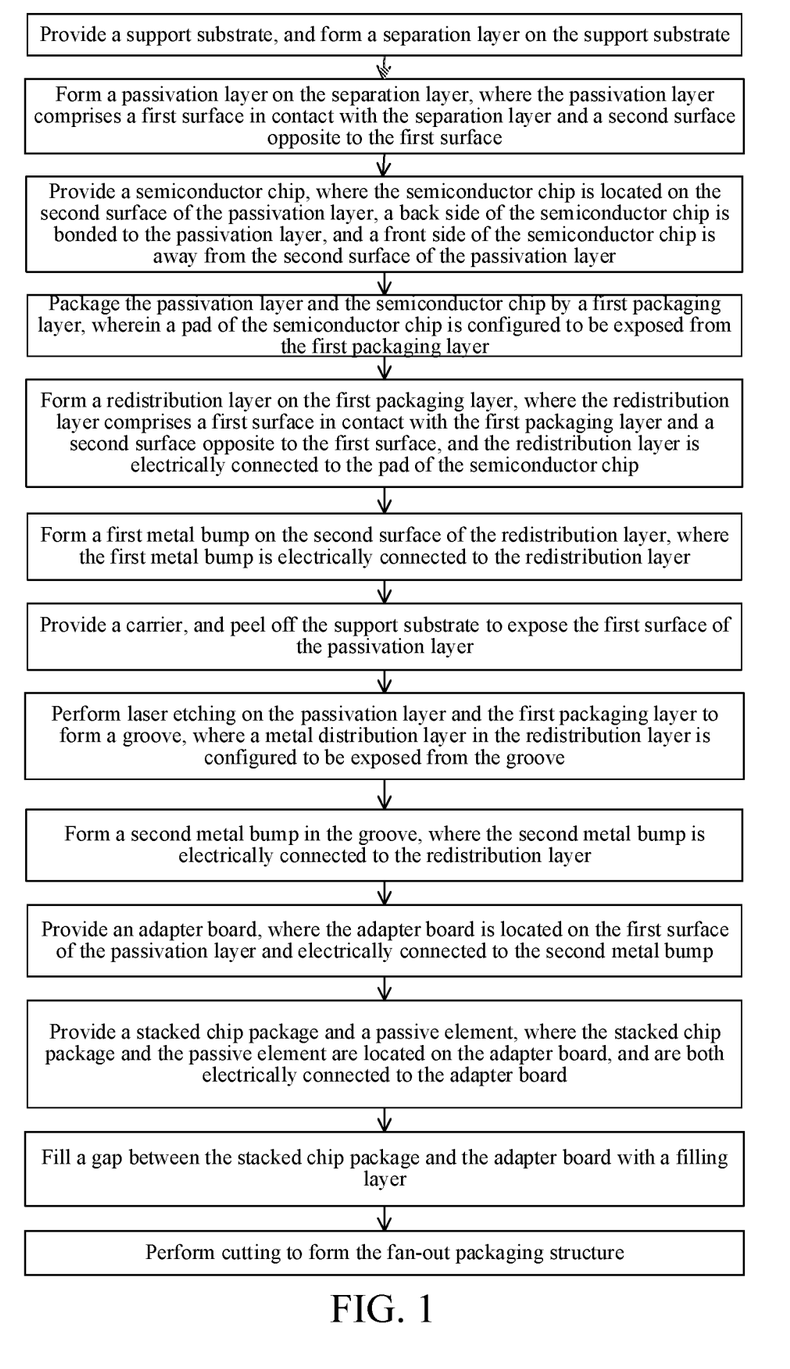
FIG. 1 is a flowchart showing process steps of preparing a fan-out chip packaging structure according to the present disclosure.

As shown in FIG. 1, the present disclosure provides a fan-out packaging method, by which various chips having different functions can be integrated into one fan-out chip packaging structure, thereby improving the integration level of the overall system. By means of the redistribution layer, an adapter board, and a three-dimensional vertically stacked packaging is achieved. In this way, the integration level of the packaging structure can be effectively improved, and the conduction paths can be significantly shortened, thereby reducing the power consumption by the subsequently prepared devices, increasing the transmission speed, and increasing the data processing capacity of the device.

Figure 2:
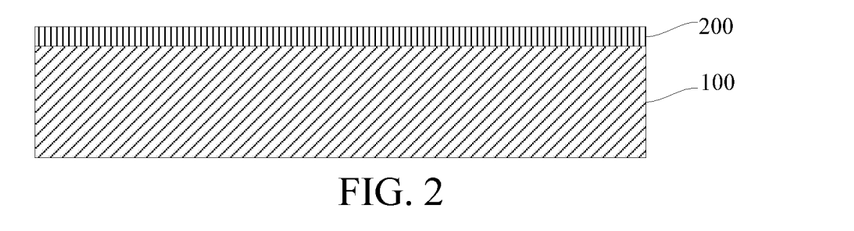
FIG. 2 to FIG. 18 are schematic diagrams showing intermediate structures obtained after various steps of preparing a fan-out chip packaging structure according to the present disclosure, where

First, referring to FIG. 2, a support substrate 100 is provided, and a separation layer 200 is formed on the support substrate 100.

As an example, the support substrate 100 may comprise one of a glass substrate, a metal substrate, a semiconductor substrate, a polymer substrate, and a ceramic substrate. In this embodiment, the support substrate 100 is preferably a glass substrate, which costs less. It is also easy to form the separation layer 200 on a glass substrate, and using a glass substrate as the support substrate 100 can ease the subsequent peeling process. The separation layer 200 may comprise one of an adhesive tape and a polymer layer. When a polymer layer is used, the surface of the support substrate 100 may be coated with polymer by a spin coating process, and then may be cured and shaped by an ultraviolet curing or heat curing process. In this embodiment, the separation layer 200 adopts a light-to-heat conversion (LTHC) layer, so that the LTHC layer can be heated by a laser in subsequent steps. In this way, the support substrate 100 can be separated from the LTHC layer, thereby rendering the peeling process easier and reducing damages.

Figure 3:
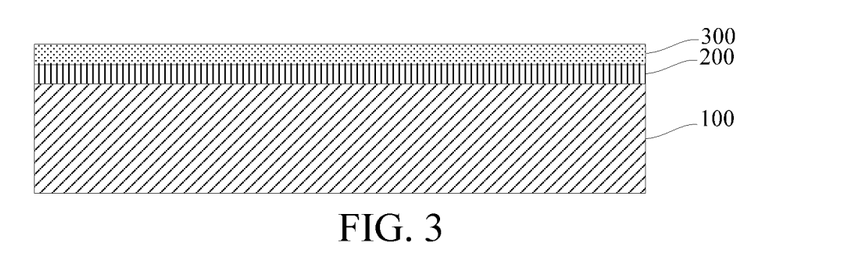
Figure 4:
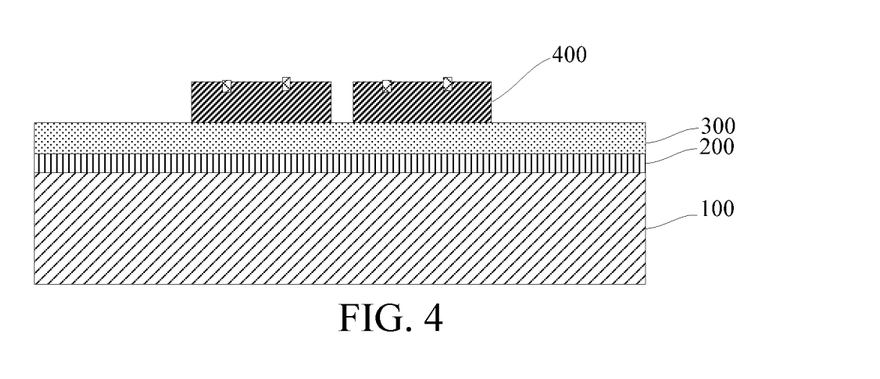

Next, referring to FIG. 3 and FIG. 4, a passivation layer 300 is formed on the separation layer 200. The passivation layer 300 comprises a first surface in contact with the separation layer 200 and a second surface opposite to the first surface.

For example, the passivation layer 300 may comprise one of epoxy resin, silica gel, polyimides (PI), PBO, benzocyclobutene (BCB), silicon oxide, phosphosilicate glass, and fluorine-containing glass. The formation and material of the passivation layer 300 are not excessively limited herein.

Next, referring to FIG. 4, a semiconductor chip 400 is provided. The semiconductor chip 400 is disposed on the second surface of the passivation layer 300. A back side of the semiconductor chip 400 is bonded to the passivation layer 300. A front side of the semiconductor chip 400 faces away from the second surface of the passivation layer 300.

Figure 5:
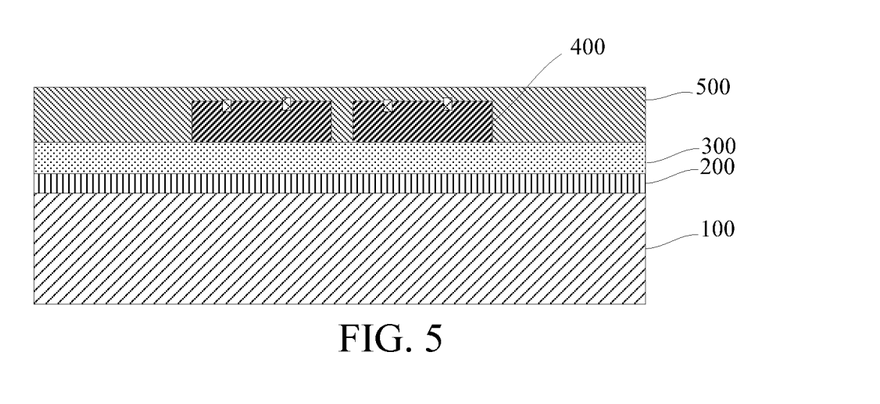
Figure 6:
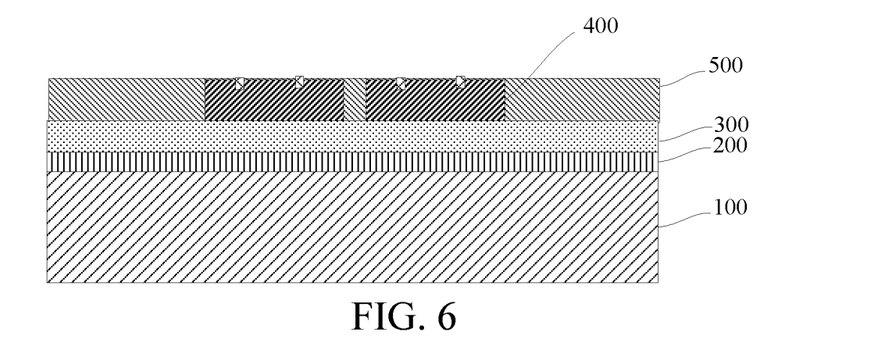

Next, referring to FIG. 5 and FIG. 6, the passivation layer 300 and the semiconductor chip 400 are packaged by the first packaging layer 500. A pad of the semiconductor chip 400 is configured to be exposed from the first packaging layer 500.

For example, the method for forming the first packaging layer 500 may comprise one of compression molding, transfer molding, liquid sealing molding, vacuum lamination, and spin coating. The material of the first packaging layer 500 may comprise one of polyimide, silica gel, and epoxy resin. After the first packaging layer 500 is formed, the method may further comprise polishing or grinding a top surface of the first packaging layer 500 to expose the top surface of the pad of the chip 400 and also to provide a flat top surface of the first packaging layer 500.

Figure 7:
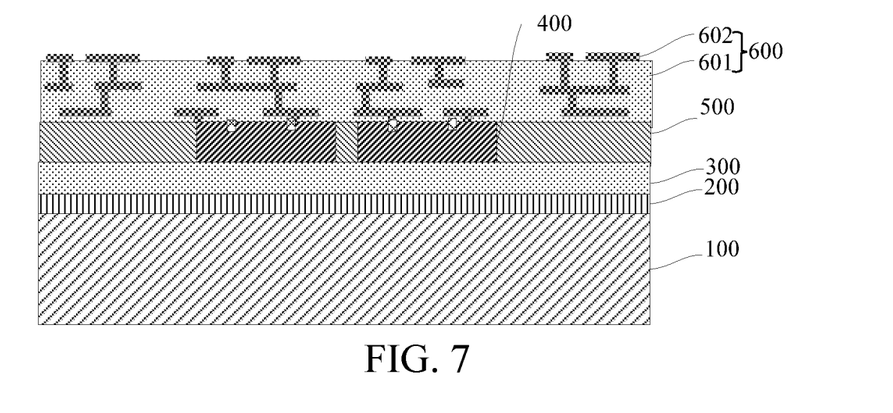

Next, referring to FIG. 7, a redistribution layer 600 is formed on the first packaging layer 500. The redistribution layer 600 comprises a first surface in contact with the first packaging layer 500 and a second surface opposite to the first surface, and the redistribution layer 600 is electrically connected to the pad of the semiconductor chip 400.

For example, the redistribution layer 600 comprises a dielectric layer 601 and a metal distribution layer 602. According to process requirements, the step of forming the dielectric layer 601 and the metal distribution layer 602 can be repeated to form more conductive channels. A material of the dielectric layer 601 may comprise one of epoxy resin, silica gel, PI, PBO, BCB, silicon oxide, phosphosilicate glass, and fluorine-containing glass. A material of the metal distribution layer 602 may comprise one of copper, aluminum, nickel, gold, silver, and titanium.

Figure 8:
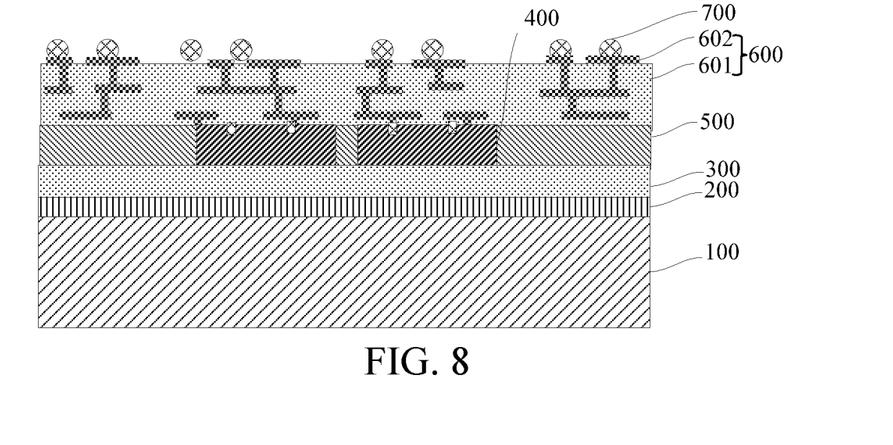

Next, referring to FIG. 8, first metal bumps 700 are formed on the second surface of the redistribution layer 600. The first metal bumps 700 are electrically connected to the redistribution layer 600. The first metal bumps 700 may comprise one of copper bumps, a nickel bumps, tin bumps, and silver bumps. The specific type of the metal bumps may be selected as desired.

Figure 9:
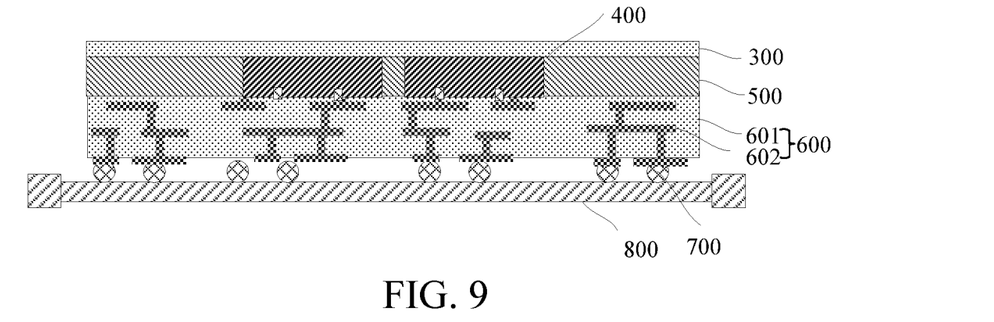

Next, referring to FIG. 9, the package structure is flipped upside down, at the side of the first metal bumps, a carrier 800 is provided to support the first metal bumps, and at the other side, the support substrate 100 is peeled off to expose the first surface of the passivation layer 300.

Figure 10:
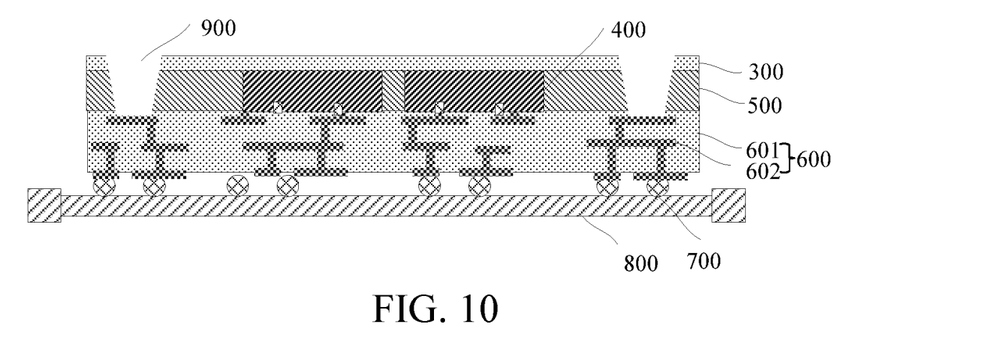

Next, referring to FIG. 10, laser etching is performed through the passivation layer 300 and the first packaging layer 500 to form a groove 900. The top of the metal distribution layer 602 in the redistribution layer 600 is then exposed from the groove 900.

Figure 11:
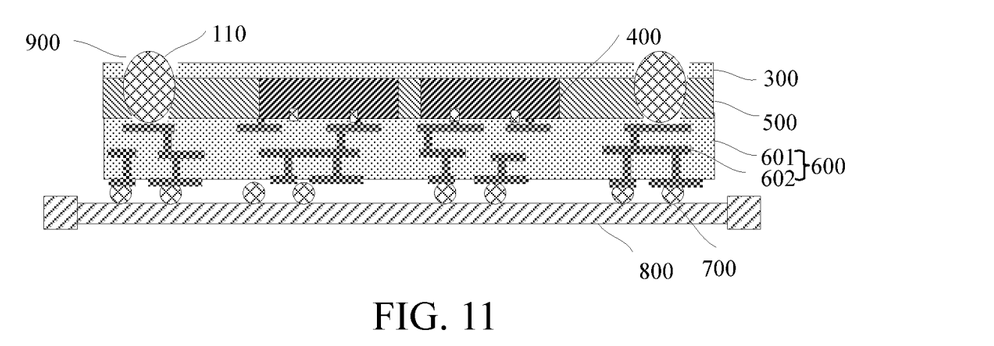

Next, referring to FIG. 11, second metal bumps 110 are formed in the groove 900. The second metal bumps 110 are electrically connected to the redistribution layer 600.

For example, the second metal bumps 110 may comprise one of copper bumps, a nickel bumps, tin bumps, and silver bumps. The specific type of the second metal bumps may be selected as desired.

As an example, the vertical height of the second metal bumps 110 is greater than the thickness of the semiconductor chip 400, so as to facilitate subsequent electrical connection between the adapter board 120 and the second metal bumps 110.

Figure 12:
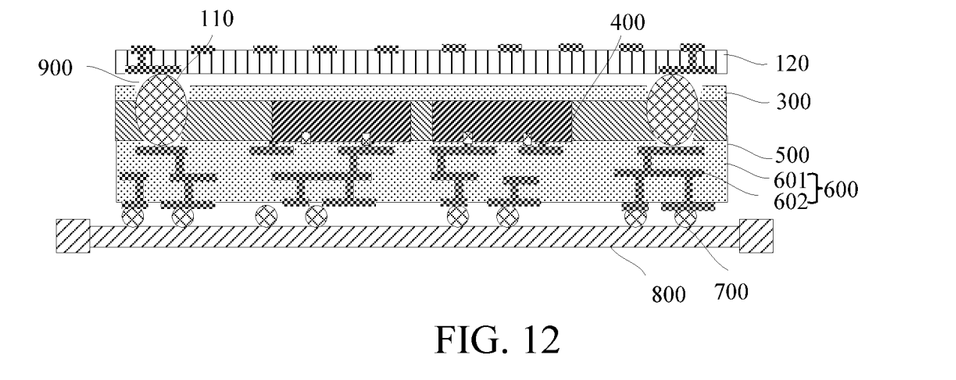

Next, referring to FIG. 12, an adapter board 120 is provided, which contains interconnecting wires. The adapter board 120 is disposed on the first surface of the passivation layer 300 and electrically connected to the interconnecting wires in the second metal bumps 110.

Figure 13:
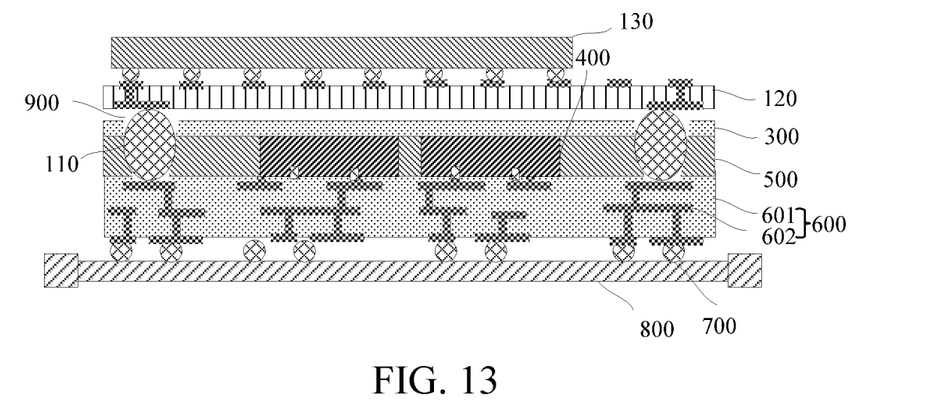
Figure 14:
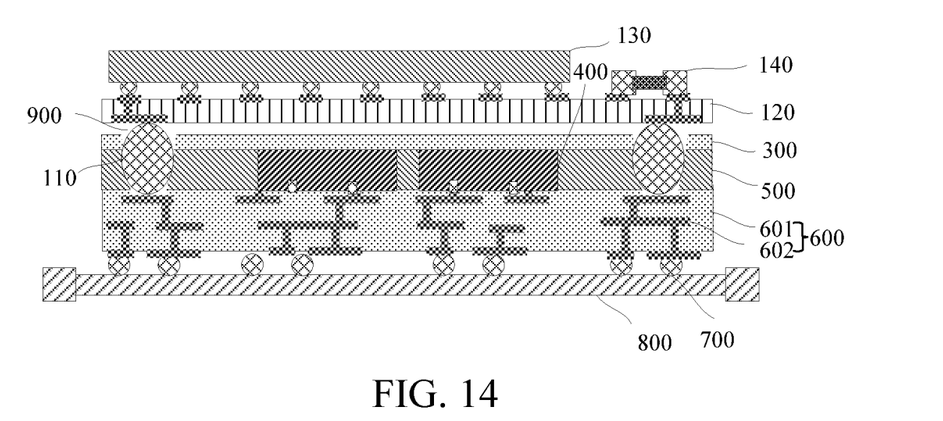

Next, referring to FIG. 13 and FIG. 14, a stacked chip package 130 and a passive element 140 are provided. The stacked chip package 130 and the passive element 140 are disposed on the adapter board 120, and are both electrically connected to the interconnecting wires in the adapter board 120.

As an example, the stacked chip package 130 comprises an ePoP memory.

As an example, the passive element 140 comprises one or more of a resistor, a capacitor, and an inductor.

For example, in one embodiment, the stacked chip package 130 is an ePoP memory, but the present disclosure is not limited thereto. Other types of packages may also be adopted as desired. Similarly, the passive element 140 may also be disposed as required, which is not excessively limited herein.

Figure 15:
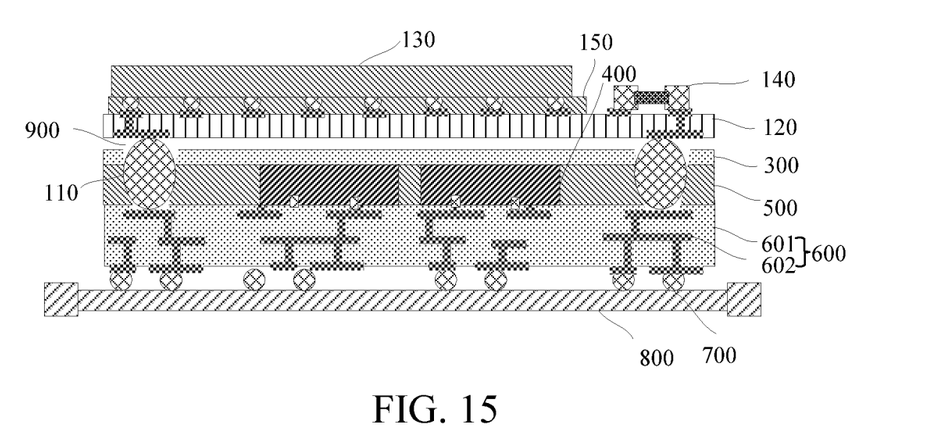

Next, referring to FIG. 15, a gap between the stacked chip package 130 and the adapter board 120 is filled with a filling layer 150.

For example, the filling layer 150 may comprise one of an epoxy resin layer, a polyimide layer, and a silica gel layer. In this way, the gap can be filled with an insulating layer (i.e., the filling layer 150) to strengthen the bonding effect between the stacked chip package 130 and the adapter board 120, so as to form a protective layer. The selection of the material of the filling layer 150 is not excessively limited herein.

Figure 16:
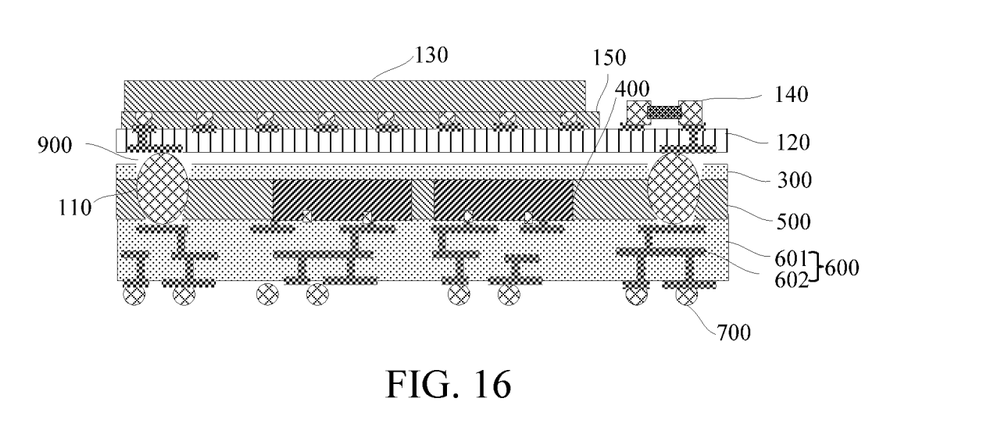

Finally, referring to FIG. 16, cutting is performed to form a fan-out packaging structure.

As an example, after the filling layer 150 is formed and before the cutting is performed, the method further comprises a step of packaging the adapter board 120, the stacked chip package 130, and the passive element 140 by a second packaging layer 160. The second packaging layer may be made of a plastic material.

Figure 17:
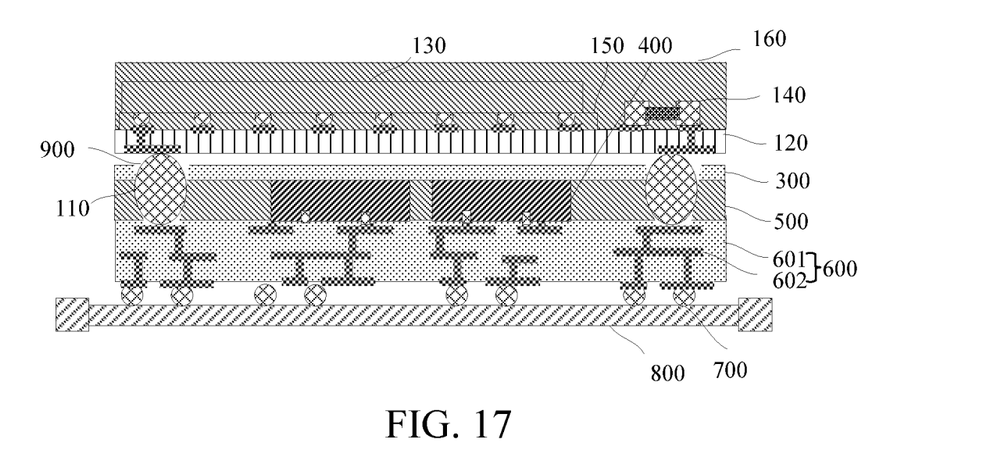
Figure 18:
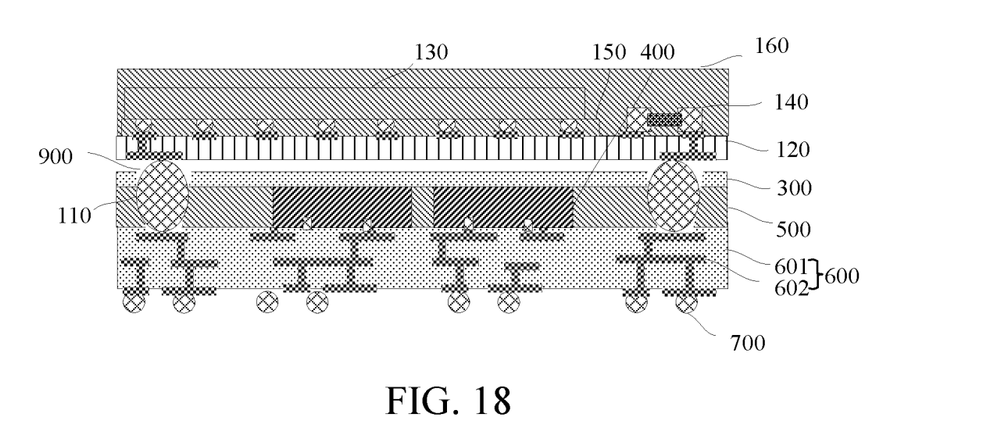

For example, referring to FIG. 17 and FIG. 18, the second packaging layer 160 comprises one of an epoxy resin layer, polyimide layer, and silica gel layer. For the specific method for preparing the second packaging layer 160, refer to descriptions of the first packaging layer 500.

Referring to FIG. 16, the present disclosure further provides a fan-out chip packaging structure. The fan-out packaging structure may be prepared by the foregoing preparation method, but the present disclosure is not limited thereto. In one embodiment, the fan-out packaging structure is prepared by the foregoing preparation method.

For example, the fan-out packaging structure comprises a redistribution layer 600, a passivation layer 300, a semiconductor chip 400, a first packaging layer 500, a groove 900, first metal bumps 700, second metal bumps 110, an adapter board 120, a stacked chip package 130, a passive element 140, and a filling layer 150.

The redistribution layer 600 comprises a first surface and a second surface opposite to each other. The passivation layer 300 comprises a first surface and a second surface opposite to each other. The semiconductor chip 400 is disposed between the second surface of the passivation layer 300 and the first surface of the redistribution layer 600. A back side of the semiconductor chip 400 is bonded to the second surface of the passivation layer 300, and a front side of the semiconductor chip 400 faces away from the passivation layer 300 and electrically connected to the redistribution layer 600. The first packaging layer 500 is disposed between the second surface of the passivation layer 300 and the first surface of the redistribution layer 600, and is configured to cover the passivation layer 300, the redistribution layer 600, and the semiconductor chip 400. The groove 900 extends through the passivation layer 300 and the first packaging layer 500 to expose a metal distribution layer 602 in the redistribution layer 600. The first metal bumps 700 are disposed on the second surface of the redistribution layer 600 and electrically connected to the redistribution layer 600. The second metal bumps 110 are disposed in the groove 900 and electrically connected to the redistribution layer 600. The adapter board 120 is disposed on the first surface of the passivation layer 300 and electrically connected to the second metal bumps 110. The stacked chip package 130 and a passive element 140 are disposed on the adapter board 120 and electrically connected to the adapter board 120. The filling layer 150 is disposed between the stacked chip package 130 and the adapter board 120, and is configured to fill a gap between the stacked chip package 130 and the adapter board 120.

As an example, the fan-out packaging structure further comprises a second packaging layer 160 configured to cover the adapter board 120, the stacked chip package 130, and the passive element 140.

As an example, the height of the second metal bumps 110 is greater than the thickness of the semiconductor chip 400.

As an example, the stacked chip package 130 comprises an ePoP memory.

As an example, the passive element 140 comprises one or more of a resistor, a capacitor, and an inductor.

As an example, the first packaging layer 500 comprises one of an epoxy resin layer, a polyimide layer, and a silica gel layer. The filling layer 150 comprises one of an epoxy resin layer, a polyimide layer, and a silica gel layer.

Based on the above description, by means of the fan-out chip packaging structure and the fan-out packaging method, consistent with the present disclosure, various chips performing different functions can be integrated into one packaging structure, thereby improving the integration level of the fan-out chip packaging structure. By means of the redistribution layer, the adapter board, and three-dimensional vertically stacked packaging is achieved. In this way, the integration level of the packaging structure can be effectively improved, and the conduction paths can be effectively shortened, thereby reducing power consumption, increasing the transmission speed, and increasing the data processing capacity.

The above embodiments only exemplarily illustrate the principles and effects of the present disclosure, but are not used to limit the present disclosure. Any person skilled in the art may make modifications or changes on the foregoing embodiments without departing from the spirit and scope of the present disclosure. Therefore, all equivalent modifications or changes made by a person of ordinary skill in the art without departing from the spirit and technical idea of the present disclosure shall be covered by the claims of the present disclosure.

What is claimed is:

1. A method of fabricating a fan-out chip package, comprising following steps:
    providing a support substrate, and forming a separation layer on the support substrate;
    forming a passivation layer on the separation layer, wherein the passivation layer comprises a first surface in contact with the separation layer and a second surface opposite to the first surface;
    providing a semiconductor chip, wherein the semiconductor chip is disposed on the second surface of the passivation layer, a back side of the semiconductor chip is bonded to the passivation layer, and a front side of the semiconductor chip faces away from the second surface of the passivation layer;
    packaging the passivation layer and the semiconductor chip by a first packaging layer, wherein a pad of the semiconductor chip is configured to be exposed from the first packaging layer;
    forming a redistribution layer on the first packaging layer, wherein the redistribution layer comprises a first surface in contact with the first packaging layer and a second surface opposite to the first surface, and the redistribution layer is electrically connected to the pad of the semiconductor chip;
    forming first metal bumps on the second surface of the redistribution layer, wherein the first metal bumps are electrically connected to the redistribution layer;
    providing a carrier, and peeling off the support substrate to expose the first surface of the passivation layer;
    performing laser etching on the passivation layer and the first packaging layer to form a groove, wherein a metal distribution layer in the redistribution layer is configured to be exposed from the groove;
    forming second metal bumps in the groove, wherein the second metal bumps are electrically connected to the redistribution layer;
    providing an adapter board, wherein the adapter board is disposed on the first surface of the passivation layer and electrically connected to the second metal bump;
    providing a stacked chip package and a passive element, wherein the stacked chip package and the passive element are disposed on the adapter board, and are both electrically connected to the adapter board;
    filling a gap between the stacked chip package and the adapter board with a filling layer; and
    performing cutting to form the fan-out packaging structure.

2. The method of fabricating the fan-out chip package as in claim 1, wherein after forming the filling layer and before performing the cutting, the method further comprises a step of packaging the adapter board, the stacked chip package, and the passive element by a second packaging layer.

3. The method of fabricating the fan-out chip package as in claim 1, wherein a height of the second metal bumps is greater than a thickness of the semiconductor chip.

4. The method of fabricating the fan-out chip package as in claim 1, wherein the stacked chip package comprises an embedded-package-on-package (ePoP) memory.

5. The method of fabricating the fan-out chip package as in claim 1, wherein the passive element comprises one or more of a resistor, a capacitor, and an inductor.

* * * * *